(12) United States Patent
Braucht et al.

(10) Patent No.: US 9,482,385 B2
(45) Date of Patent: Nov. 1, 2016

(54) PIVOTING EQUIPMENT MOUNTING BRACKET

(71) Applicants: Michael Braucht, Richardson, TX (US); Mark Montgomery, Van Alstyne, TX (US)

(72) Inventors: Michael Braucht, Richardson, TX (US); Mark Montgomery, Van Alstyne, TX (US)

(73) Assignee: Fujitsu Limited, Kawasaki (JP)

( * ) Notice: Subject to any disclaimer, the term of this patent is extended or adjusted under 35 U.S.C. 154(b) by 23 days.

(21) Appl. No.: 14/540,993

(22) Filed: Nov. 13, 2014

(65) Prior Publication Data

US 2016/0138755 A1    May 19, 2016

(51) Int. Cl.
*H05K 5/02* (2006.01)
*F16M 13/02* (2006.01)

(52) U.S. Cl.
CPC .......... *F16M 13/022* (2013.01); *H05K 5/0217* (2013.01)

(58) Field of Classification Search
None
See application file for complete search history.

(56) References Cited

U.S. PATENT DOCUMENTS

| | | | |
|---|---|---|---|
| 5,584,396 A * | 12/1996 | Schmitt | H05K 7/16 211/26 |
| 5,765,743 A | 6/1998 | Sakiura et al. | |
| 6,193,341 B1 * | 2/2001 | Eizadkhah | H05K 7/16 312/223.1 |
| 6,357,712 B1 * | 3/2002 | Lu | F16M 11/10 248/185.1 |
| 6,386,120 B1 | 5/2002 | Nelson et al. | |
| 6,523,918 B1 | 2/2003 | Baiza | |
| 7,408,767 B2 * | 8/2008 | Han | G06F 1/187 312/223.2 |
| 7,471,466 B2 * | 12/2008 | Bendror | G02B 25/005 359/802 |
| 8,054,624 B2 * | 11/2011 | Chen | G06F 1/187 248/918 |
| 8,401,357 B2 | 3/2013 | Solheid et al. | |
| 9,083,031 B2 * | 7/2015 | Bolden | H01M 2/1077 |
| 2005/0274680 A1 * | 12/2005 | Allen | A47B 88/044 211/26 |
| 2007/0035853 A1 * | 2/2007 | Bendror | G02B 25/005 359/802 |
| 2010/0314514 A1 * | 12/2010 | Nelson | F16M 11/08 248/219.1 |
| 2011/0291852 A1 | 12/2011 | Forristal et al. | |
| 2013/0134115 A1 * | 5/2013 | Hernandez-Ariguznaga | H05K 7/16 211/26 |

\* cited by examiner

*Primary Examiner* — Courtney Smith
*Assistant Examiner* — Rashen E Morrison
(74) *Attorney, Agent, or Firm* — Baker Botts L.L.P.

(57) ABSTRACT

A system and assembly for mounting components of equipment is disclosed. The assembly includes a mount assembly configured to rotate between a first position and a second position. The mount assembly includes a first and second mount. Each mount has a plunger to allow rotation of the mount assembly, and an end for attachment to a component of equipment. The assembly further includes a first brace coupled to the first mount and a second brace coupled to the second mount. Each brace has a first end for attachment to a surface, a second end having an open hem to retain the respective mount, a plurality of pivot holes configured to receive the plunger, and a pivot point coupling the respective mount and the brace.

18 Claims, 4 Drawing Sheets

PIVOTING EQUIPMENT MOUNTING BRACKET

TECHNICAL FIELD

The present disclosure relates generally to equipment mounting and, more particularly, to a pivoting equipment mounting bracket.

BACKGROUND

Telecommunications systems, cable television systems, and data communication networks use optical networks to rapidly convey large amounts of information between remote points. In an optical network, information is conveyed in the form of optical signals through optical fibers. Optical fibers comprise thin strands of glass capable of transmitting the signals over long distances with very low loss. Optical networks provide higher capacity and reduced operating costs compared to traditional technologies. Fiber-optic networks may include a system of multiple network components, including switches, routers, converters, modulators, demodulators, etc.

A communications network may include one or more communication cabinets. Communication cabinets are used to store, or house, a variety of communication equipment, allow organization of the equipment, and permit interconnection of different communication cables. A communication cabinet may include a structure that provides a bay for mounting various components of the communication network.

SUMMARY

In accordance with an embodiment of the present disclosure, and assembly for mounting components of equipment is disclosed. The assembly includes a mount assembly configured to rotate between a first position and a second position. The mount assembly includes a first and second mount. Each mount has a plunger to allow rotation of the mount assembly, and an end for attachment to a component of equipment. The assembly further includes a first brace coupled to the first mount and a second brace coupled to the second mount. Each brace has a first end for attachment to a surface, a second end having an open hem to retain the respective mount, a plurality of pivot holes configured to receive the plunger, and a pivot point coupling the respective mount and the brace.

In accordance with another embodiment of the present disclosure, a communication cabinet for components of equipment is disclosed. The cabinet includes a mount assembly configured to rotate between a first position and a second position. The mount assembly includes a first and second mount. Each mount has a plunger to allow rotation of the mount assembly, and an end for attachment to a component of equipment. The cabinet further includes a first brace coupled to the first mount and a second brace coupled to the second mount. Each brace has a first end for attachment to a surface, a second end having an open hem to retain the respective mount, a plurality of pivot holes configured to receive the plunger, and a pivot point coupling the respective mount and the brace.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Embodiments of the present disclosure and its advantages are best understood by referring to FIGS. 1A-3 of the drawings, like numerals being used for like and corresponding parts of the various drawings.

Figure 1A:
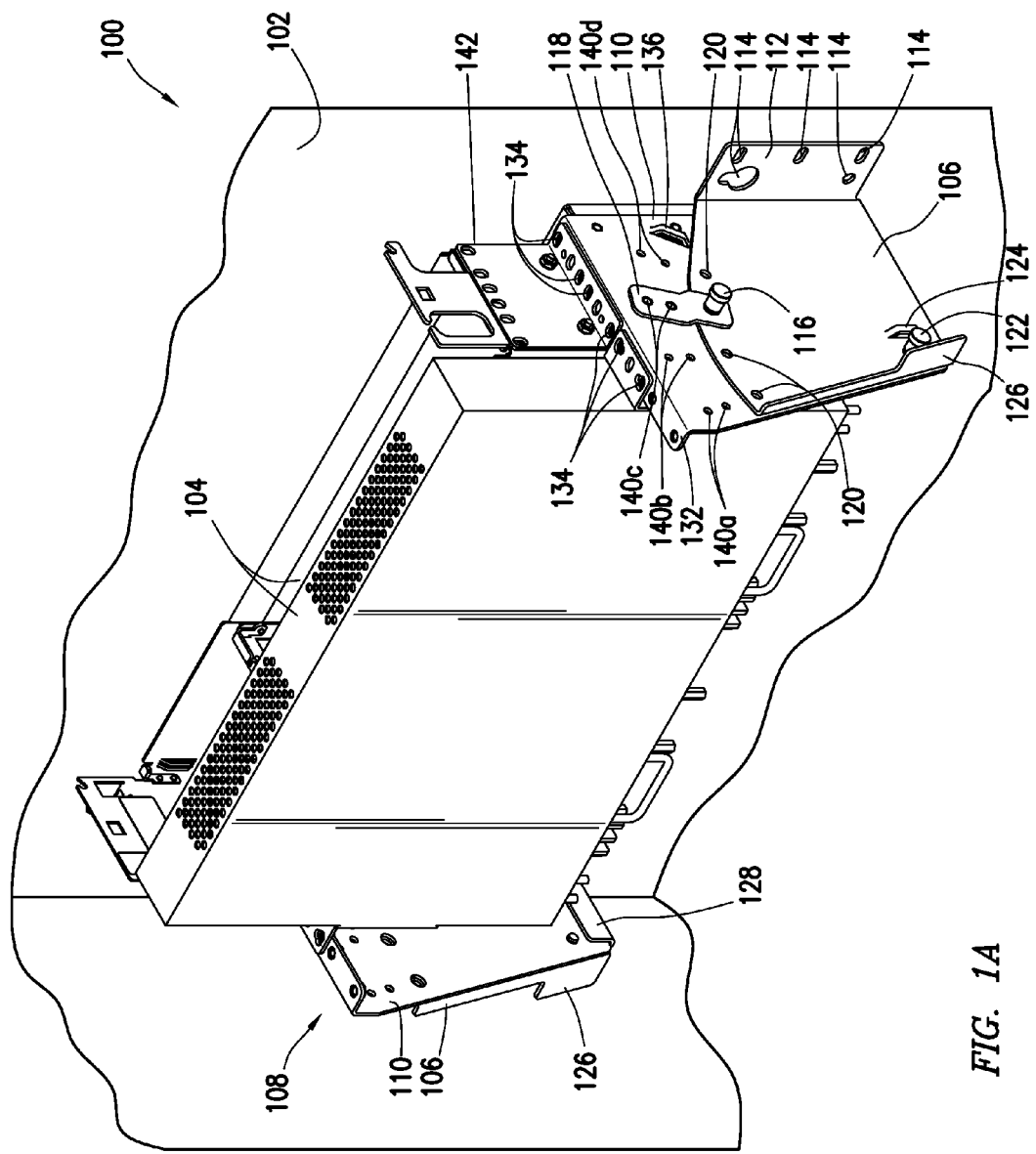
FIGS. 1A and 1B illustrate an exemplary pivoting equipment mounting bracket assembly in accordance with embodiments of the present disclosure.
Figure 1B:
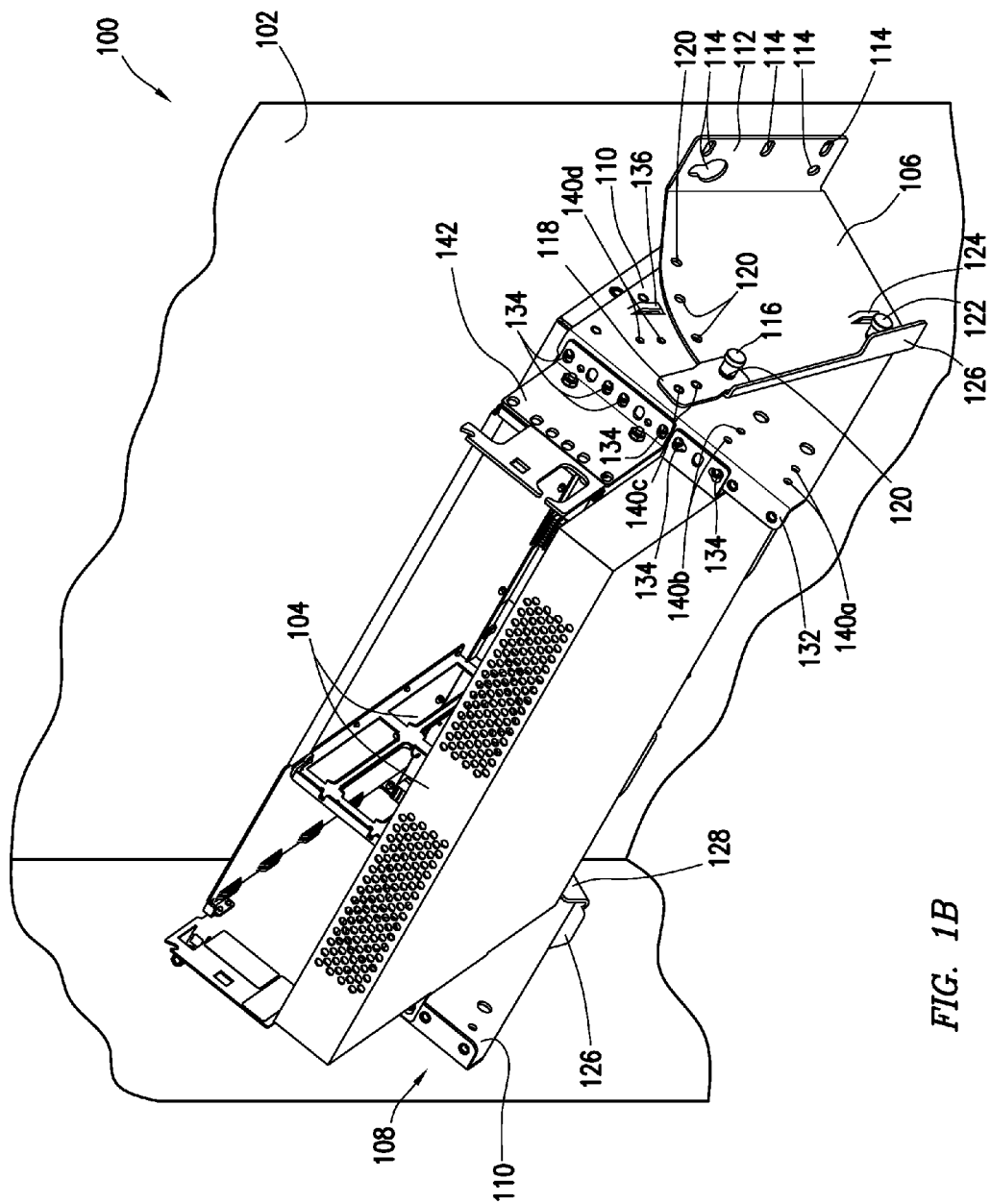

FIGS. 1A and 1B illustrate an exemplary pivoting equipment mounting bracket assembly 100 in accordance with embodiments of the present disclosure. FIG. 1A show assembly 100 in a closed, storage, or retracted position. FIG. 1B shows assembly 100 in a maintenance or extended position. Assembly 100 may include braces 106 and mount assembly 108. Assembly 100 may be utilized to mount and store one or more communication equipment 104. For example, equipment 104 may include power modules, switching equipment, or any other suitable communication components. In some embodiments, mount assembly 108 may be configured to support equipment 104 and pivot relative to braces 106. Extending assembly 100 may allow an operator to change settings, connect or disconnect cables, insert or remove equipment, or perform any other suitable maintenance that may not be possible or easy to accomplish when equipment 104 is in the fully retracted position. When fully retracted, equipment 104 may be stored substantially vertically allowing the use of shallow cabinets and other cabinets with spatial constraints. Accordingly, embodiments of the present disclosure increase of accessibility of equipment 104 for maintenance, removal, and/or installation.

Assembly 100 may be located in any suitable communication cabinet. For example assembly 100 may be located in communication cabinet 102, in a rack, or attached directly to a wall or other surface outside of any cabinet or rack. In some embodiments, communication cabinet 102 may be any one of a variety of telecommunication cabinets, electrical cabinets, outside plant cabinets, central office cabinets, service area interface, access point, cross box, cross-connect box, or any other suitable cabinet designed to store communication equipment. For example, cabinet 102 may be an outside plant cabinet. Communication cabinet 102 may be configured to provide a relatively small footprint and simplify cable connections between various components.

Cabinet 102 may be adapted for storage and operation of multiple communication components. For example, cabinet 102 may include computers, cables, switches and/or other suitable communication components. Cabinet 102 may be configured to be a stand-alone cabinet, mounted to a wall or other surface, or otherwise configured for a suitable application. Cabinet 102 may be any standard or non-standard cabinet. Standard cabinets are generally compliant with industry accepted standards which dictate their dimensions, physical strength, and other characteristics, while non-standard cabinets may be compliant with a portion or none of such industry standards. The dimensions of cabinet 102 may be based on the dimensions of the equipment to be installed in cabinet 102. For example, the width of cabinet 102 may be based on the standard width of telecommunication equipment. The depth of cabinet 102 may vary based on available space and equipment to be stored and accessed. For example, cabinet 102 may be a shallow cabinet such that communication equipment 104 may have to be stored substantially vertically inside cabinet 102. Further, cabinet 102 may include a cover or door.

In some embodiments, assembly 100 may include two braces 106. Braces 106 provide mechanical support to mount assembly 108 and equipment 104. When installed, braces 106 are rigidly secured to cabinet 102, or other surface, on opposing sides of equipment 104 and, when mounted in cabinet 102, are interposed between equipment 104 and the sides of cabinet 102. Braces 106 may be located on the left and right sides of equipment 104 from the perspective of a person facing the front of cabinet 102. However, in some embodiments, equipment 104 may be rotated and braces 106 may be configured on top and bottom of equipment 104 from the perspective of a person facing the front of cabinet 102, or at any other angle based on the specific implementation.

Figure 2B:
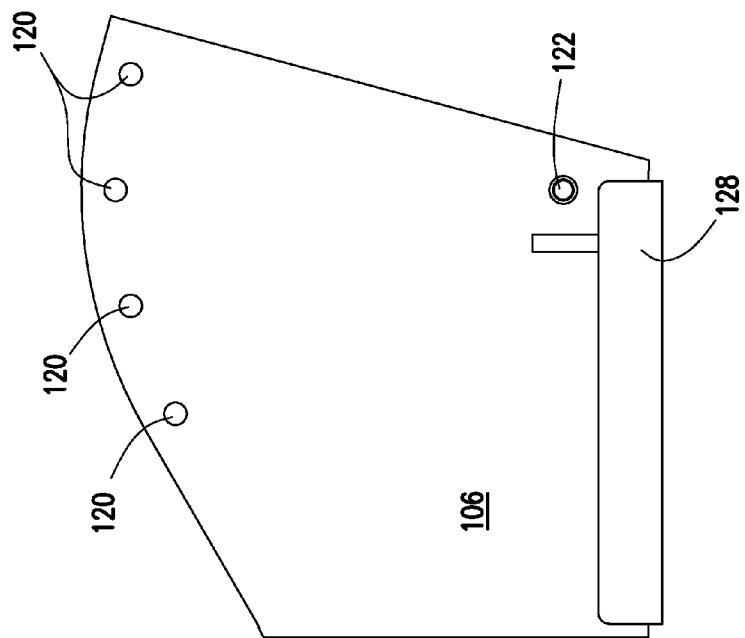
FIGS. 2A and 2B illustrate two sides of an example brace for a pivoting equipment mounting bracket in accordance with embodiments of the present disclosure.
Figure 2A:
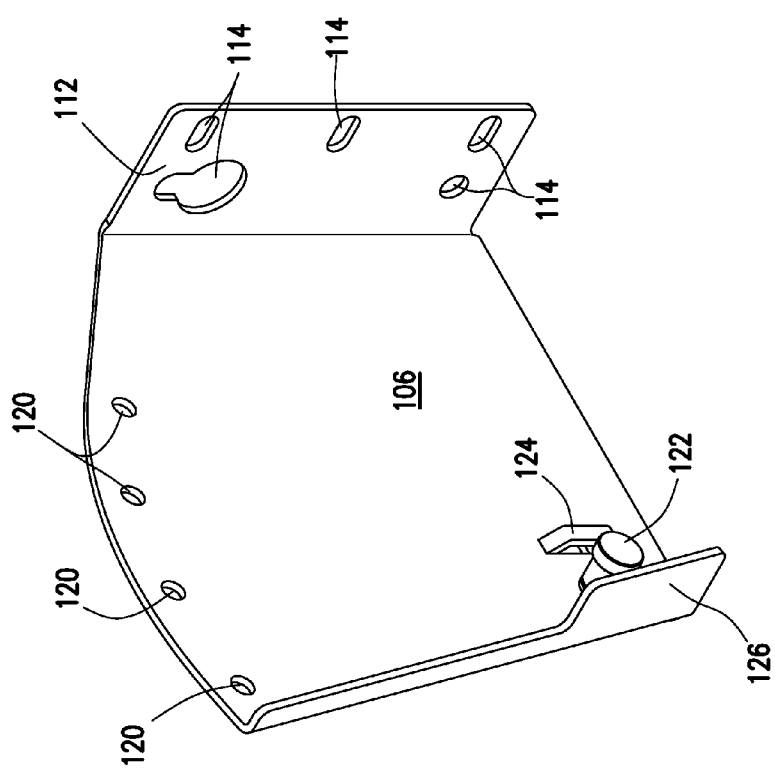

Further details of brace 106 are shown with reference to FIGS. 2A and 2B that illustrate two sides of an example brace 106 for a pivoting equipment mounting bracket in accordance with embodiments of the present disclosure. FIG. 2A shows a side of brace 106 that faces away from mount assembly 110 and equipment 106 when installed. FIG. 2B shows the side of brace 106 that faces toward mount assembly 110 and equipment 106 when installed. Brace 106 may include flange 112, one or more mounting holes 114, one or more pivot holes 120, pivot point 122, lance 124, guard 126, and open hem 128.

Brace 106 may include one end with flange 112 configured to attach to a surface. For example, flange 112 may attach with screws or other suitable hardware to cabinet 102, a rack, a wall, or any other suitable surface. Flange 112 may include one or more mounting holes 114 that may be circular, oval, slotted, or any other suitable configuration to allow brace 106 to be rigidly attached to a surface to which it is secured.

In some embodiments, brace 106 may include one or more pivot holes 120 and pivot point 122. Pivot holes 120 may extend through brace 106, and may be spaced apart on an arched section of brace 106. Pivot point 122 may be the point about which mount assembly 108 rotates. Referring to FIG. 1A, pivot point 122 may include any hardware or mechanism for coupling brace 106 and mount 110. For example, pivot point 122 may include a spring-loaded plunger, a screw and corresponding nut, a screw and threaded hole, or any other hardware or combination or hardware. In the current example, pivot point 122 includes a spring-loaded plunger that, when engaged, extends through and couples brace 106 and mount 110 while allowing mount assembly 108 to rotate. Pivot point 122 may be proximate to guard 126, which may serve to prevent accidental disengagement of a spring-loaded plunger located at pivot point 122. Pivot holes 120 are configured and located to receive spring-loaded plunger 116 attached to mount assembly 108. When spring-loaded plunger 116 is disengaged, for example rotated and pulled out, mount assembly 108 may be allowed to rotate a number of degrees, for example, approximately fifteen degrees. When rotation of mount assembly 108 is completed, spring-loaded plunger 116 may reengage by extending through brace 106 and mount 110 and lock mount assembly 108 in place. Pivot holes 120 may be placed to allow mount assembly 108 to rotate about pivot point 122 a defined number of degrees before stopping. For example, pivot holes 120 may be spaced to allow approximately 15 degrees of rotation between pivot holes 120. In the current example, there may be four pivot holes 120 resulting in a total rotation of approximately 45 degrees. However, pivot holes 120 may be located to result in any suitable amount of total or partial rotation per the specific implementation. Additionally, brace 106 may include one or more lances 124 for directing and securing cables as needed. Use of lances 124 may assist in ensuring that cables or other wires do not interfere with pivoting motion.

Further, in some embodiments, brace 106 may include open hem 128 as shown in detail in FIG. 2B. Open hem 128 may also be referred to as a "curved section." Open hem 128 be configured to serve as a stop or support when assembly 100 is in the fully retracted position as shown with reference to FIG. 1A. For example, when mount assembly 108 is rotated such that equipment 104 is substantially vertical, an edge of mount 110 may contact the inner radius of open hem 128.

Figure 3:
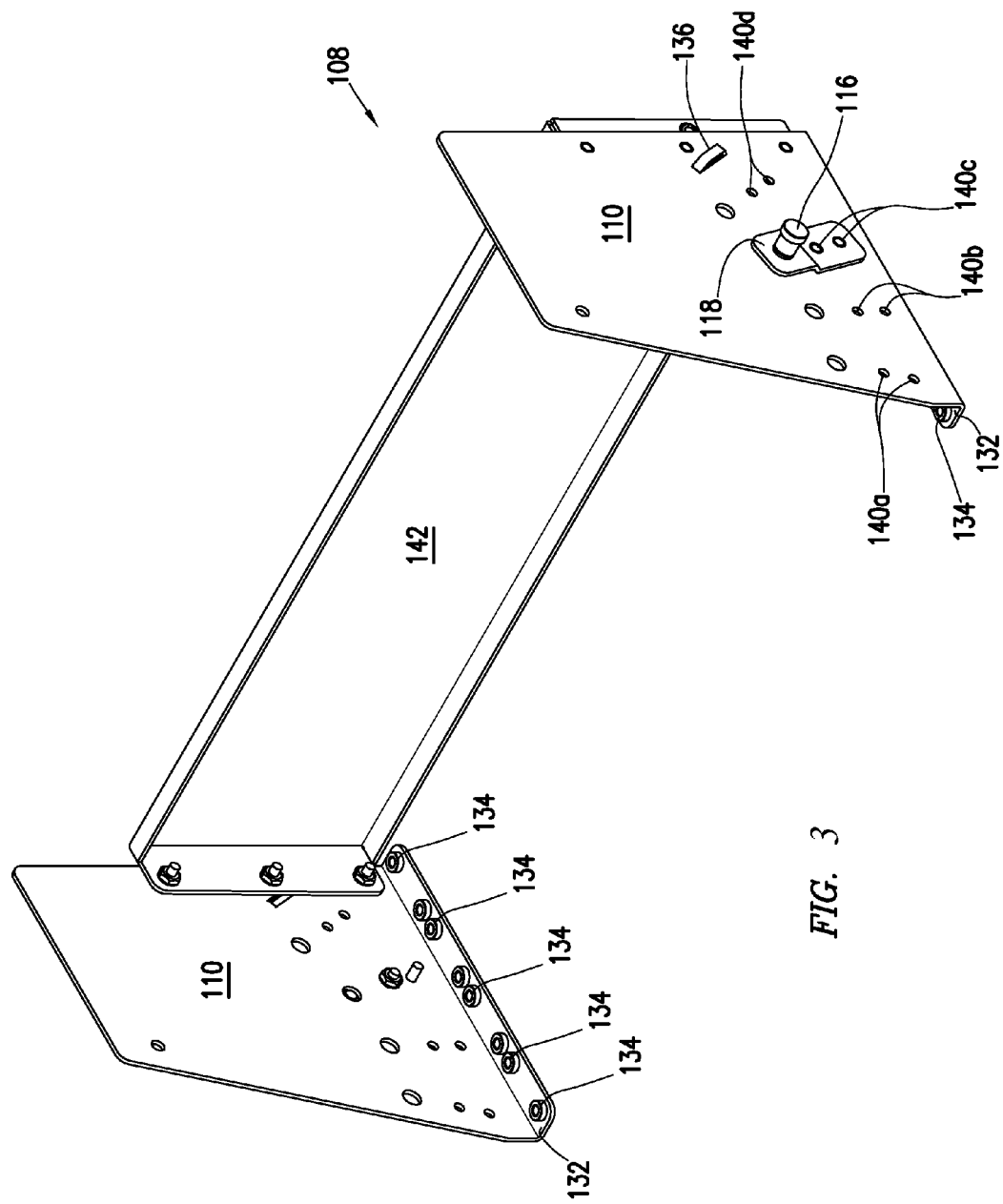
FIG. 3 illustrates an exemplary mount assembly in accordance with embodiments of the present disclosure.

FIG. 3 illustrates an exemplary mount assembly 108 in accordance with embodiments of the present disclosure. Mount assembly 108 includes two mounts 110 that may include spring-loaded plunger 116 and plunger support arm 118. In some embodiments, mount assembly 108 may include a tray 142, also shown with reference to FIG. 1B, configured between mounts 110. Tray 142 may be of a particular length and provide additional support to equipment 104. For example, tray 142 may be dimensioned to accommodate equipment 104 that is a standard size, such as 19 inches or 23 inches, or any other suitable dimensions. Further, tray 142 may be configured to adjust between multiple dimensions. Tray 142 may be attached to mounts 110 using screws, threaded holes, rivets, or any other suitable hardware or attachment mechanism. However, in some embodiments, tray 142 may not be included in mount assembly 108. In such a case, braces 106 and mounts 110 may be spaced apart by any predefined distance to accommodate the dimensions of equipment 104.

Mount 110 may include sets of attachment holes 140a-140d (collectively "attachment holes 140") for attaching plunger support arm 118. Attachment holes 140 may be placed to confine the degree of rotation of mount assembly 108 to rotate about pivot point 122 to a defined number of degrees before stopping. For example, attachment holes 140 may be spaced to allow approximately 15 degrees of rotation between attachment holes 140. In the current example, there may be four sets of attachment holes 140a-140d. Placing arm 118 in the set of attachment holes 140a may allow little or no rotation for mount assembly 108. However, placing arm 118 in attachment holes 140d may allow the maximum rotation for mount assembly 108, e.g., approximately 45 degrees. Attachment holes 140 may be located to result in any suitable amount of rotation per the specific implementation. Thus, the amount of rotation allowed for mount assembly 108 may be based on both the location of arm 118 in attachment holes 140 and the location of pivot holes 120 on braces 106.

Mounts 110 may include attachment end 132 for attachment of one or more components of equipment 104. Attachment end 132 may include multiple holes 134 spaced as needed to accommodate brackets or other mounting hardware included with equipment 104. For example, spacing of holes 134 may be based on a EIA wide format, universal standard, metric spacing, not-standard spacing, or any other suitable spacing. Further mounts 110 may include one or more lances 136 to route and secure cabling as needed. Use of lances 136 may assist in ensuring that cables or other wires do not interfere with pivoting motion.

Any portion of assembly 100 may be constructed of any suitable material. For example, any portions of assembly 100 may be low carbon cold finished steel with an electro-plated zinc coating, stainless steel, aluminum, or any other suitable material to provide sufficient support to equipment 104.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An assembly for mounting components of equipment, the assembly comprising:
   a mount assembly rotatable between a first position and a second position, the mount assembly including a first and second mount, each mount having:
      a plunger to allow rotation of the mount assembly between the first position and the second position; and
      an end including multiple holes for attaching a component of equipment; and
   a first brace coupled to the first mount and a second brace coupled to the second mount, each brace having:
      a first end for attachment to a surface;
      a second end having an open hem to retain the respective mount such that when the mount assembly is rotated to the second position, an edge of the respective mount contacts an inner radius of the open hem and the end of each mount that includes the multiple holes for attaching the component of equipment is substantially perpendicular to the first end of each brace;
      a plurality of pivot holes to receive the plunger; and
      a pivot point coupling the respective mount and the brace.

2. The assembly of claim 1, wherein the first brace and the second brace include a plurality of pivot holes to receive the plunger during rotation of the mount assembly.

3. The assembly of claim 2, wherein the plurality of pivot holes allow rotation of the mount assembly such that the component of equipment rotates from substantially vertical to 45 degrees.

4. The assembly of claim 1, wherein the mount assembly further includes a tray attached to the first mount and the second mount.

5. The assembly of claim 4, wherein the tray is adjustable.

6. The assembly of claim 1, wherein the first brace and the second brace are attachable to the surface a predefined distance apart.

7. The assembly of claim 6, wherein the predefined distance is based on a dimension of the component of equipment.

8. The assembly of claim 1, wherein each mount further includes:
   a set of attachment holes extending through the mount;
   a plunger support arm attached to the set of attachment holes to contain each respective brace; and
   the plunger attached to the plunger support arm to couple the mount and the brace during rotation of the mount assembly.

9. The assembly of claim 1, wherein the pivot point includes a spring-loaded plunger.

10. A communication cabinet for components of equipment, the cabinet comprising:
    a mount assembly rotatable between a first position and a second position, the mount assembly including a first and second mount, each mount having:
       a plunger to allow rotation of the mount assembly between the first position and the second position; and
       an end including multiple holes for attaching a component of equipment; and
    a first brace coupled to the first mount and a second brace coupled to the second mount, each brace having:
       a first end for attachment to the cabinet;
       a second end having an open hem to retain the respective mount such that when the mount assembly is rotated to the second position, an edge of the respective mount contacts an inner radius of the open hem and the end of each mount that includes the multiple holes for attaching the component of equipment is substantially perpendicular to the first end of each brace;
       a plurality of pivot holes to receive the plunger; and
       a pivot point coupling the respective mount and the brace.

11. The cabinet of claim 10, wherein the first brace and the second brace include a plurality of pivot holes to receive the plunger during rotation of the mount assembly.

12. The cabinet of claim 11, wherein the plurality of pivot holes allow rotation of the mount assembly such that the component of equipment rotates from substantially vertical to 45 degrees.

13. The cabinet of claim 10, wherein the mount assembly further includes a tray attached to the first mount and the second mount.

14. The cabinet of claim 13, wherein the tray is adjustable.

15. The cabinet of claim 10, wherein the first brace and the second brace are attachable to the surface a predefined distance apart.

16. The cabinet of claim 15, wherein the predefined distance is based on a dimension of the component of equipment.

17. The cabinet of claim 10, wherein each mount further includes:
    a set of attachment holes extending through the mount;
    a plunger support arm attached to the set of attachment holes to contain each respective brace; and
    the plunger attached to the plunger support arm to couple the mount and the brace during rotation of the mount assembly.

18. The cabinet of claim 10, wherein the pivot point includes a spring-loaded plunger.

* * * * *